(12) United States Patent
Oh

(10) Patent No.: US 6,806,133 B2
(45) Date of Patent: Oct. 19, 2004

(54) METHOD FOR FABRICATING SEMICONDUCTOR DEVICE WITH TRIPLE WELL STRUCTURE

(75) Inventor: Jae-Geun Oh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,250

(22) Filed: Dec. 30, 2002

(65) Prior Publication Data

US 2003/0216016 A1 Nov. 20, 2003

(30) Foreign Application Priority Data

May 16, 2002 (KR) ........................................ 2002-27110

(51) Int. Cl.[7] ........................................ H01L 21/8238
(52) U.S. Cl. ........................ 438/223; 438/224; 438/228
(58) Field of Search ........................ 438/199, 222–224, 438/227–228, 414, 416; 257/369, 371

(56) References Cited

U.S. PATENT DOCUMENTS

| | | | |
|---|---|---|---|
| 5,432,105 A | 7/1995 | Chien | |
| 5,668,024 A | 9/1997 | Tsai et al. | |
| 5,759,885 A | 6/1998 | Son | |
| 5,858,831 A | 1/1999 | Sung | |
| 6,010,926 A | * | 1/2000 | Rho et al. .................. 438/199 |
| 6,026,028 A | 2/2000 | Lin et al. | |
| 6,077,734 A | 6/2000 | Lee | |
| 6,174,775 B1 | 1/2001 | Liaw | |
| 6,207,532 B1 | 3/2001 | Lin et al. | |
| 6,258,641 B1 | * | 7/2001 | Wong et al. ................. 438/199 |

FOREIGN PATENT DOCUMENTS

| | | |
|---|---|---|
| JP | 8-274324 A | 10/1996 |
| JP | 8-288402 A | 11/1996 |
| JP | 9-27556 A | 1/1997 |
| JP | 10-21685 A | 1/1998 |
| JP | 11-186405 | 7/1999 |
| JP | 11-284146 A | 10/1999 |
| JP | 2000-195816 A | 7/2000 |
| KR | 1998-57037 | 9/1998 |

* cited by examiner

*Primary Examiner*—Phat X. Cao
*Assistant Examiner*—Theresa T. Doan
(74) *Attorney, Agent, or Firm*—Birch, Stewart, Kolasch & Birch, LLP

(57) ABSTRACT

A method for fabricating a triple well in a semiconductor device, includes the steps of forming a first well of a first conductive type with a first concentration lower than a first target concentration, wherein the first concentration is the minimum dose capable of isolating neighboring wells each other and forming a second well of a second conductive type with a second concentration higher than a second target concentration, wherein the second well includes a first region surrounded by the first well and a second region isolated from the first region by the first well.

20 Claims, 9 Drawing Sheets

METHOD FOR FABRICATING SEMICONDUCTOR DEVICE WITH TRIPLE WELL STRUCTURE

FIELD OF THE INVENTION

The present invention relates to a method for fabricating a semiconductor device; and, more particularly, to a method for fabricating a triple well in a semiconductor device.

DESCRIPTION OF RELATED ART

Generally, semiconductor products are manufactured by a complementary metal-oxide-semiconductor field effect transistor (CMOSFET) technology, that is two kinds of field effect transistor, i.e., NMOSFET and PMOSFET, are configured on one wafer. In order to manufacture the NMOSFET and PMOSFET on one wafer at the same time, a well formation technology is required to divide the NMOSFET and PMOSFET.

A typical well formation technology requires a thermal treatment process of a high temperature for a long time after an ion-implantation process is carried out with a low energy. Since the well formation technology requires a thermal treatment for a long time, there is a disadvantage for an aspect of a semiconductor device fabrication cost and, since a doping concentration of the ion is uniformly decreased in a vertically downward direction from a surface of a wafer. Thus, a control of the semiconductor device is limited.

A profiled well formation technology is recently tried to solve the above problems. In accordance with the profiled well formation technology, a ions are implanted with high-energy to a desired depth, and then a simple thermal treatment process is carried out in order to prevent punchthrough, latch-up and the like.

The well formation technology is classified with a twin-well and a triple well according to the number of kinds of wells formed on one wafer. The triple well is composed of two p-wells and one deep n-well surrounding one of the p-wells. The triple well has advantages that a property of an NMOSFET formed on the p-well can be differently controlled and the NMOSFET has a good property against an external noise. Accordingly, the well formation technology is recently changed from a diffusion twin-well process to the profiled triple well process.

Generally, the NMOSFET formed on the p-well, which is surrounded by the n-well of the triple well, is used as a cell transistor. As a gate length of the cell transistor is decreased, threshold voltage thereof is also decreased, so that a threshold voltage roll-off is caused. Namely, a threshold voltage distribution is broadened with a lack of uniformity. The threshold voltage distribution is broadened, since gate length variation is increased as a size of the transistor becomes smaller and a threshold voltage roll-off of a small transistor is increased. Therefore, in order to secure a uniform characteristic of a cell transistor, it is preferable to have uniform threshold voltage distribution and to solve the threshold voltage roll-off.

FIGS. 1A to 1E are cross sectional views illustrating a fabrication process of a semiconductor device having a triple well according to the prior art.

Referring to FIG. 1A, after a field oxide layer 12 is formed through a shallow trench isolation (STI) on a semiconductor substrate 11, a photosensitive layer is coated and a first mask 13 with the photosensitive layer is formed through a patterning process including exposing and developing processes.

Subsequently, the first mask 13 is used as an ion implantation mask, and n-type impurities are implanted into the semiconductor substrate 11 by using a high energy ion implanter. Thus, a first region 14 of a profiled n-well is formed in the semiconductor substrate 11.

Referring to FIG. 1B, a second mask 15 is formed by patterning a photosensitive layer coated on the semiconductor substrate 11 through exposing and developing processes, the second mask 15 is employed as an ion implantation mask and n-type impurities are implanted into the semiconductor substrate 11 by using a high energy ion implanter, so that second and third regions 16 and 17 of a profiled n-well are formed.

The second region 16 of the profiled n-well is a middle n-well ion implantation region and the third region 17 is a p channel field stop ion implantation region. A numeral reference '18' in FIG. 1B shows a doping profile of the profiled n-well.

Referring to FIG. 1C, after stripping the first and second masks 13 and 15, a third mask 19 is formed by patterning a photosensitive layer coated on the semiconductor substrate 11 through exposing and developing processes. The third mask 19 is employed as an ion implantation mask and p-type impurities are implanted into the semiconductor substrate 11 by using a high energy ion implanter, so that first and second regions 20, 21 are formed. The first and second regions 20, 21 represent a p-well ion implantation region and an n-channel field stop ion implantation region, respectively. A numeral reference 22 shows a doping profile of the profiled p-well.

Referring to FIG. 1D, the profiled n-well and p-well are activated through a furnace annealing process, so that a triple well formation process is completed. The triple well is composed of a first p-well 23, a deep n-well 24 adjacent to the first p-well 23, a second p-well 25 surrounded by the deep n-well 24 and positioned at a predetermined distance from the first p-well 23.

A transistor to be formed on the second p-well 25 is independent of a transistor to be formed on the first p-well 23. The second p-well 25 has an advantage that can be protected from an external voltage or noise suddenly applied, because the second p-well 25 is surrounded by the deep n-well 24. For this reason, a cell transistor is formed on the second p-well 25.

A photosensitive layer is coated on the semiconductor substrate 11, in which the triple well is completely formed, and a fourth mask 26, exposing a portion of the semiconductor substrate 11 to form a cell transistor, is formed through a patterning process with exposing and developing the photosensitive layer. Thereafter, p-type impurities are implanted into the overall second p-well 25 to adjust a threshold voltage of the cell transistor by using the fourth mask 26 as an ion implantation mask, so that a threshold voltage ion implantation region 27 is formed.

Referring to FIG. 1E, after removing the fourth mask 26, a gate oxide layer 28 and a gate electrode 29A are formed on a predetermined region of the semiconductor substrate 11, and a spacer 29B is formed on sidewalls of the gate electrode 29A. Thereafter, impurities of n and p types are implanted to form an $n^+$ source/drain region 30A of an NMOSFET and a $p^+$ pocket ion implantation region (source/drain region) 30B for a PMOSFET in a peripheral circuit.

FIG. 2 is a detailed cross sectional view along with line 'X' in FIG. 1E.

Referring to FIG. 2, even though the p-type impurities are implanted to adjust the threshold voltage of the cell transistor according to the prior art as mentioned above, junction loss occurs due to a counter doping effect, since the threshold voltage ion implantation region 27 and the n+ source/drain region of cell junction are mostly overlapped. Thus, resistance and electric field are increased and a refresh time is reduced. Accordingly, reliability of a device is deteriorated.

In order to adjust the threshold voltage necessary to an operation of the cell transistor, pre-determined p-type impurities are required to be implanted in a channel region. If the dose of the p-type impurities is increased, the threshold voltage is increased as much as required. However, the counter doping effect is considerably increased and a refresh characteristic is became worse. Therefore, there is a problem of selecting one appropriate ion implantation condition between to conditions, for forming the source/drain and adjusting the threshold voltage of the cell transistor which have a trade-off relation.

FIG. 3 is a graph showing dopant profiles analyzed with secondary ion mass spectrometer (SIMS) after carrying out a thermal treatment process to the ion implantation region for the threshold voltage and the source/drain region.

Referring to FIG. 3, if an ion-implantation dose of boron is increased in order to adjust the threshold voltage necessary to an operation of the cell transistor, the threshold voltage of the cell transistor may be increased to a desired voltage. However, a counter doping effect is also increased, so that a concentration of a source/drain region that is in a cell junction region is decreased and an electrical loss is largely caused.

Accordingly, a refresh characteristic of a cell junction formed as above is more deteriorated.

SUMMARY OF THE INVENTION

It is, therefore, an object of the present invention to provide a method for fabricating a triple well capable of obtaining a threshold voltage of a transistor and suppressing a counter doping effect in a semiconductor device.

In accordance with an aspect of the present invention, there is provided to a method for fabricating a triple well in a semiconductor device, comprising the steps of: forming a first well of a first conductive type with a first concentration lower than a first target concentration, wherein the first concentration is the minimum dose capable of isolating neighboring wells each other; and forming a second well of a second conductive type with a second concentration higher than a second target concentration, wherein the second well includes a first region surrounded by the first well and a second region isolated from the first region by the first well.

In accordance with another aspect of the present invention, there is provided a method forming a semiconductor device, comprising steps of: forming a first well of a first conductive type with a first concentration lower than a first target concentration in a semiconductor substrate, wherein the first concentration is the minimum dose capable of isolating neighboring wells each other; forming a second well of a second conductive type with a second concentration higher than a second target concentration, the second well surrounded by the first well; implanting impurities of the second conductive type to adjust a threshold voltage of a transistor to be formed on a surface of the semiconductor substrate; forming a gate oxide layer and a gate electrode on a predetermined region on the second well; and forming source/drain regions with a first conductive type at both sides of the gate electrode in the second well.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

FIGS. 4A to 4E are cross-sectional views illustrating a fabricating process of a semiconductor device having a triple well structure in accordance with the present invention.

Figure 1A:
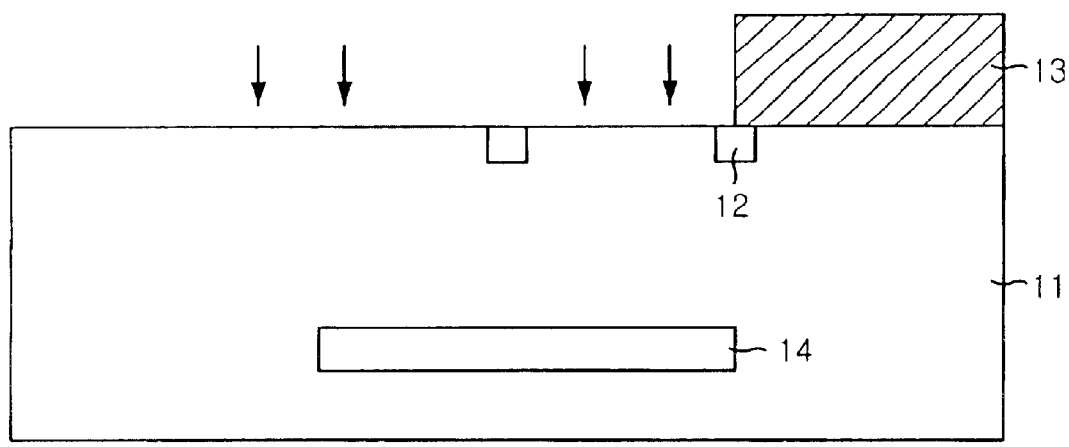
FIGS. 1A to 1E are cross sectional views illustrating a fabrication process of a semiconductor device having a triple well according to the prior art.
Figure 1B:
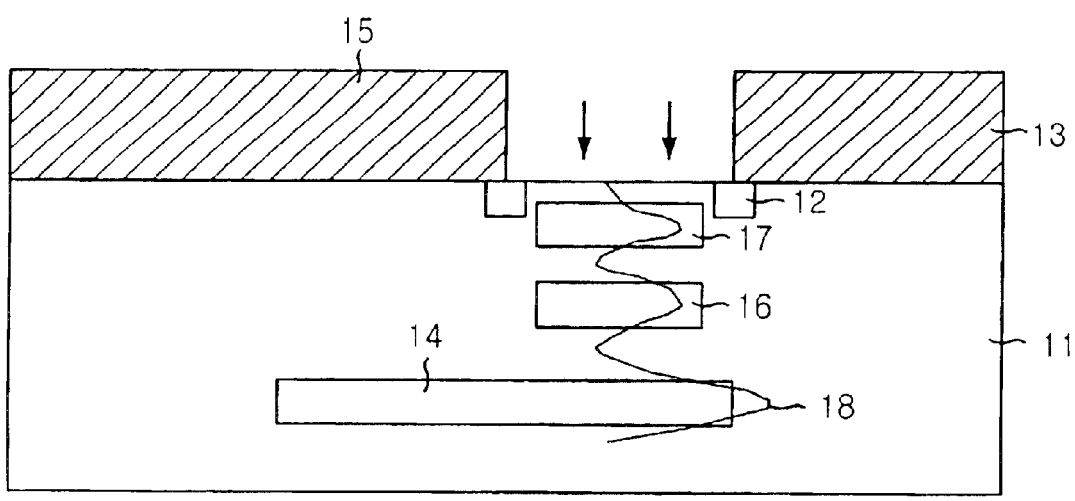
Figure 1C:
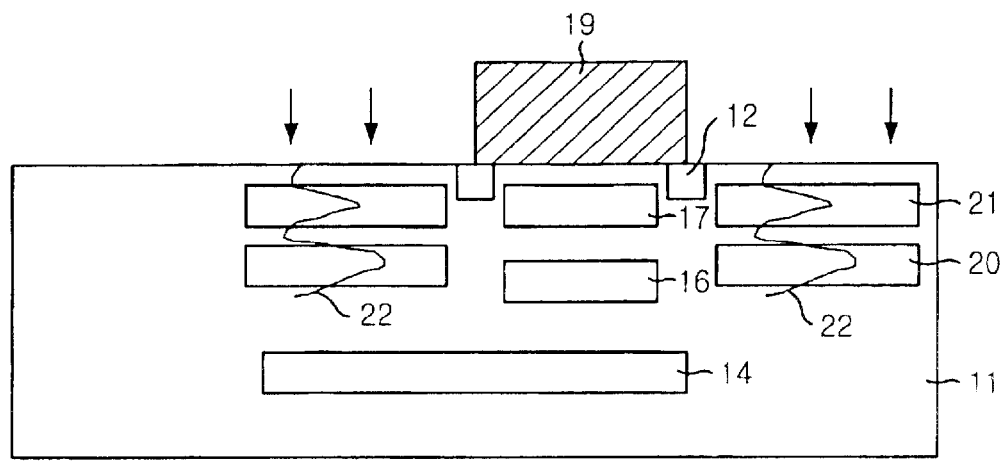
Figure 1D:
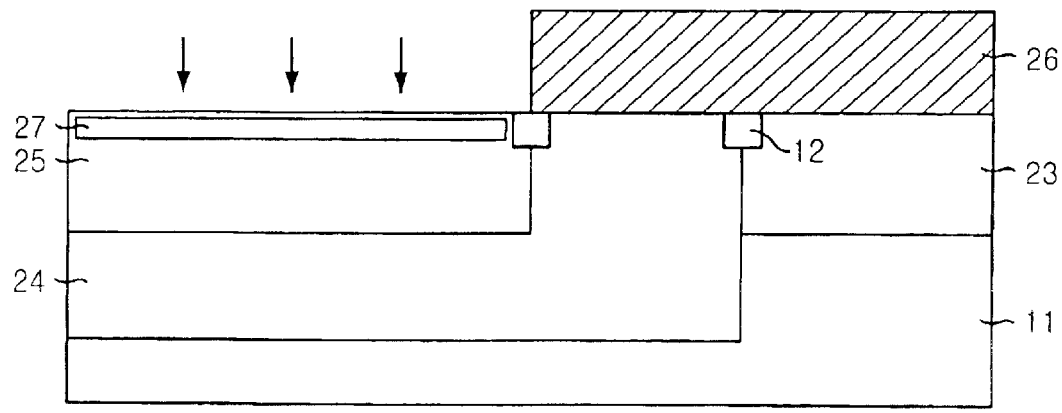
Figure 1E:
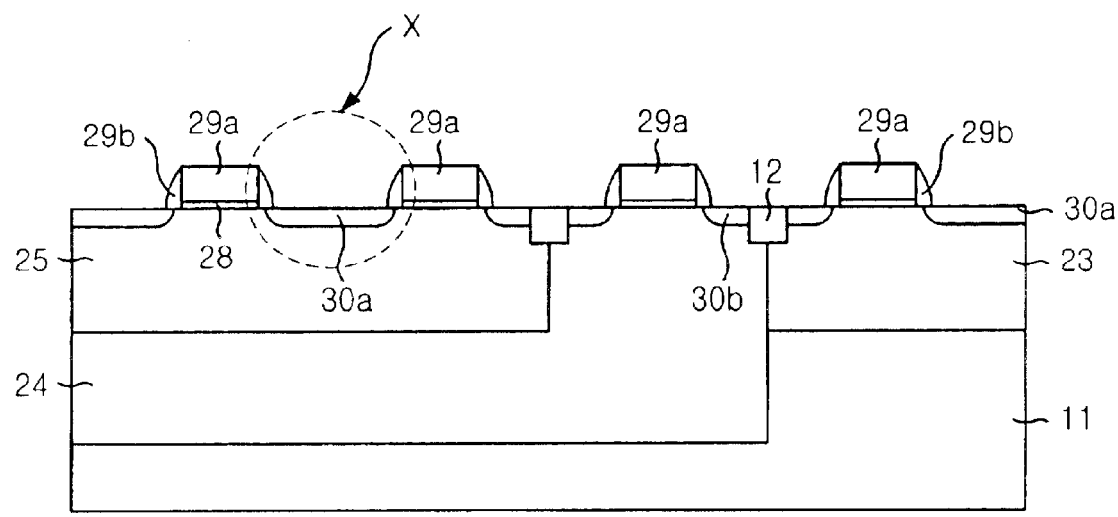
Figure 2:
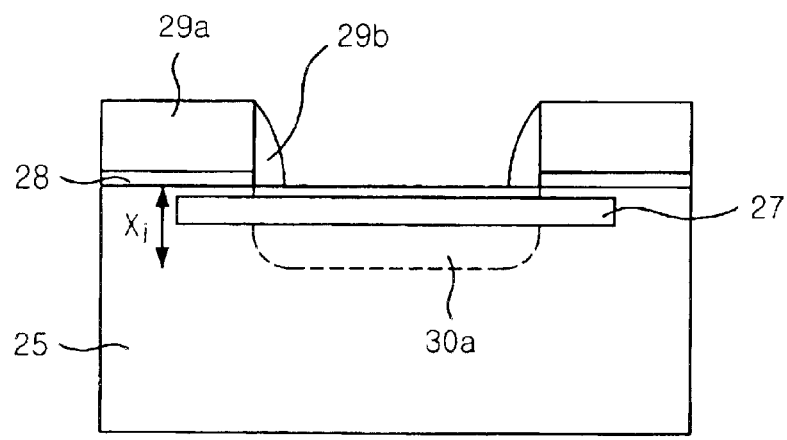
FIG. 2 is a detailed cross sectional view alone a line 'X' in FIG. 1E.
Figure 3:
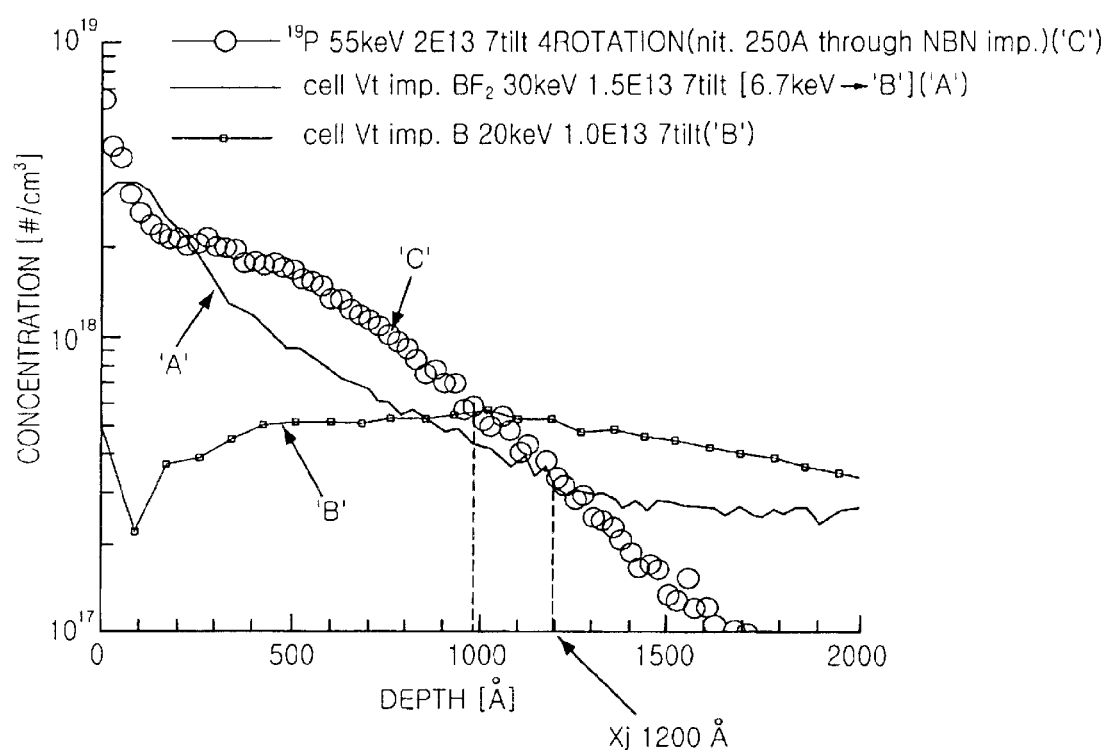
FIG. 3 is a graph showing dopant profiles analyzed with SIMS after carrying out a thermal treatment process to the ion implantation region for the threshold voltage and the source/drain region.
Figure 4A:
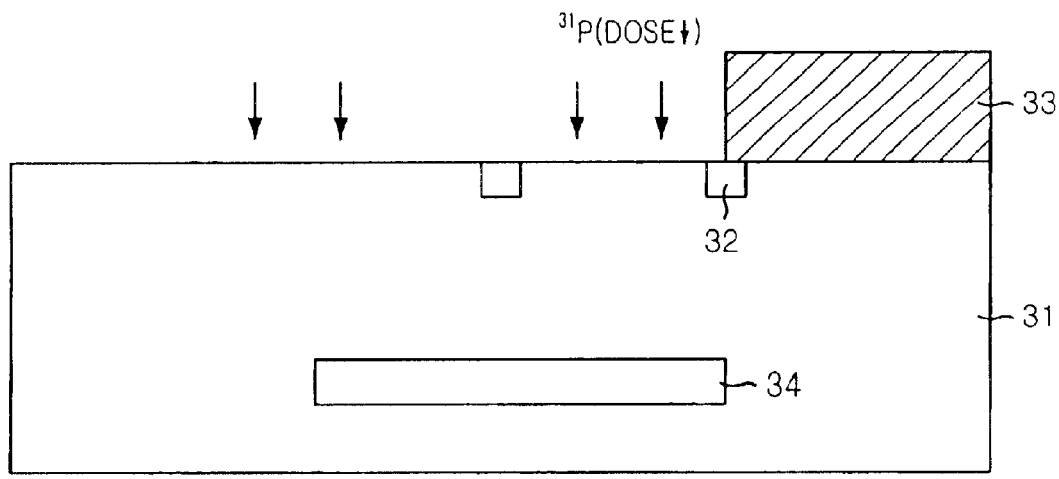
FIGS. 4A to 4E are cross sectional views illustrating a fabricating process of a semiconductor device having a triple well structure in accordance with the preferred embodiment of the present invention.

Referring to FIG. 4A, after a field oxide layer 32 for isolation between devices is formed on a semiconductor substrate 31 through a shallow trench isolation (STI) process, a photosensitive layer is coated on the semiconductor substrate 32 and then a first mask 33 is formed by a patterning process with exposing and developing processes. The first mask 33 is formed with a photosensitive layer suitable for a high energy ion implantation at a density of about 1 g/cm$^3$ to about 10 g/cm$^3$ and at a thickness of over 2.5 μm.

Subsequently, $^{31}$P ions of an n-type dopant are implanted in a predetermined portion of the semiconductor substrate 31, which is exposed by the first mask 33, with an ion implanter, so that a deep n-well ion implantation region 34 is formed. At this time, considering a junction leakage current, the ion implantation process is carried out with an ion implantation energy of about 0.6 MeV to about 1.6 MeV and with $^{31}$p ion dose of about 5×10$^{12}$ ions/cm$^2$ to about 1.5×10$^{13}$ ions/cm$^2$ less than that a target dose. The reason using the dose less than that of the target dose is to reduce a junction leakage current, and the dose less than the target dose, is the minimum dose necessary for forming the n-well ion implantation region 34 isolating adjacent p-wells.

Accordingly, dose reduction at the deep n-well ion implantation region 34 has an effect that dopant concentration of adjacent p-wells on which cell transistors will be formed, is increased.

Figure 4B:
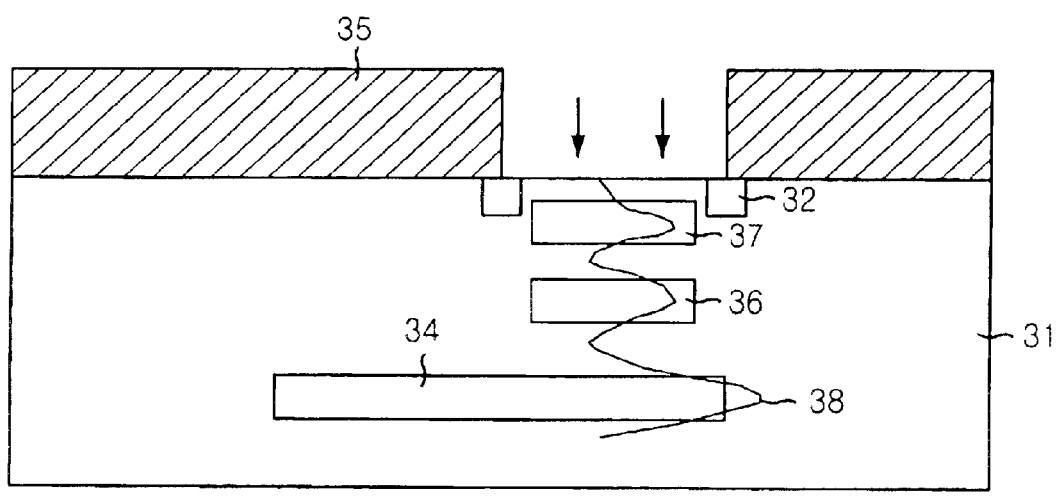

Referring to FIG. 4B, after a photosensitive layer is coated on the semiconductor substrate 31, a second mask 35 is formed by a patterning process with exposing and developing processes. N-type dopant is implanted by using the first and second masks 33 and 35 as an ion implantation mask with a high energy ion implanter, so that a middle ion implantation region 36 and a p channel field stop ion implantation region 37 are formed.

$^{31}$P ions are used at the middle n-well ion implantation process. It is preferable that dose of the $^{31}$P ions is of about 5×10$^{12}$ ions/cm$^2$ to about 2×10$^{13}$ ions/cm$^2$ and an ion implantation energy is of about 500 keV to about 600 keV. Also, $^{31}$P ions are used at the p channel field stop ion implantation process. It is preferable that dose of the $^{31}$P ions is of about $5 \times 10^{11}$ ions/cm$^2$ to about $2 \times 10^{13}$ ions/cm$^2$ and an ion implantation energy is of about 150 kev to about 300 keV. The n-well ion implantation region 34, the middle n-well ion implantation region 36 and the p channel field stop ion implantation region 37 form a profiled n-well through the above implantation process. The numeral reference '38' denoted in FIG. 4B represents a doping profile of the profiled n-well.

Figure 4C:
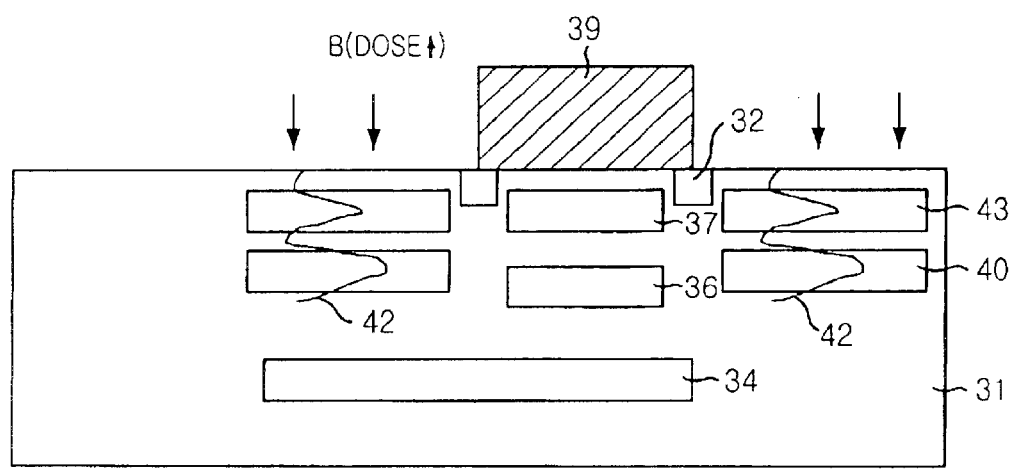

Referring to FIG. 4C, after the second mask 35 is stripped, a third mask 39 is formed by a patterning process with exposing and developing processes after coating a photosensitive layer. A p-type dopant is implanted by using the third mask 39 as an ion implantation mask with a high energy ion implanter, so that a p-well ion implantation region 40 and an n-channel field stop ion implantation region 41 are formed. At this time, it preferable that the p-well implantation is carried out with boron (B) of a concentration of about $5 \times 10^{12}$ ions/cm$^2$ to about $3 \times 10^{13}$ ions/cm$^2$ and in an ion implantation energy of about 180 keV to about 300 keV. The n-channel field stop ion implantation process is carried out with boron (B) ions of a concentration of about $5 \times 10^{11}$ ions/cm$^2$ to about $1 \times 10^{13}$ ions/cm$^2$ and in an ion implantation energy of about 50 keV to about 80 keV. The p-well ion implantation region 40 and the n-channel field stop ion implantation region 41 form a profiled p-well. The numeral reference '42' denoted in FIG. 4C represents a doping profile of the profiled p-well.

Since the dose in the p-well ion implantation is reduced less than that in the n-well ion implantation, the dose of p-type dopant can be increased.

Subsequently, referring to FIG. 4C, after the third mask 39 is stripped, the profiled n-well and the dopant implanted in the p-well are activated through a furnace annealing process so that a triple well formation process is completed. The triple well includes a first p-well 43, a deep n-well 44 adjacent to the first p-well 43 and a second p-well 45 surrounded by the deep n-well 44 and positioned at a predetermined distance with the first p-well 43.

A transistor to be formed on the second p-well 45, is independent of a transistor to be formed on the first p-well 43. The second p-well 45 has an advantage that can be protected from an external voltage or noise suddenly applied, because the second p-well 45 is surrounded by the deep n-well 24. For this reason, a cell transistor is to be formed on the second p-well 45.

Figure 4D:
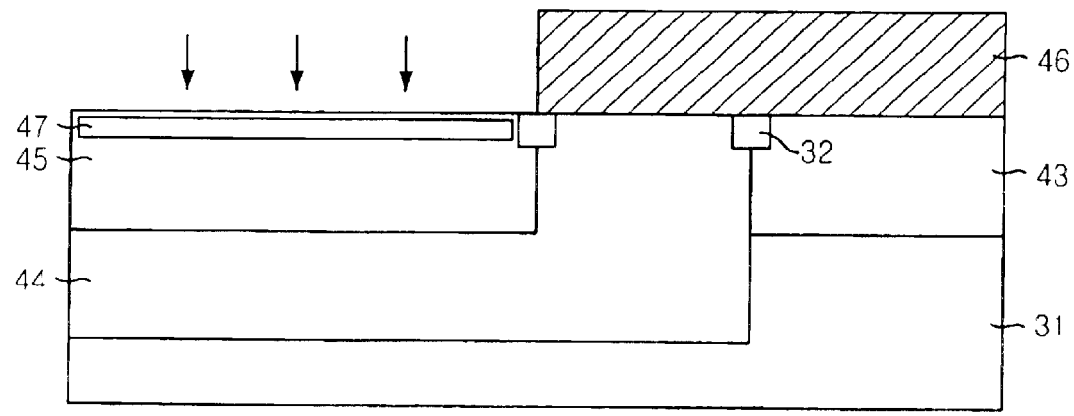

Referring to FIG. 4D, a photosensitive layer is coated on the semiconductor substrate 31 and a fourth mask 46 is formed through a patterning process with exposing and developing processes. The fourth mask 46 exposes a portion of the semiconductor substrate 31, i.e. the second p-well 45, on which a cell transistor is to be formed. After forming the fourth mask 46, p-type impurities are implanted into the overall second p-well 45 to adjust a threshold voltage of the cell transistor by using the fourth mask 46 as an ion implantation mask, so that a threshold voltage ion implantation region 47 is formed.

Boron (B) or boron diflouride (BF$_2$) is implanted as the p-type impurities to adjust the threshold voltage of the cell transistor. At this time, Boron (B) or boron diflouride (BF$_2$) is implanted with dose of about $5 \times 10^{12}$ ions/cm$^2$ to about $1.5 \times 10^{13}$ ions/cm$^2$. In case that the boron (B) is implanted, it is preferable that an ion implantation energy is about 15 keV to about 40 keV and, in case that the boron diflouride (BF$_2$) is implanted, it is preferable that an ion implantation energy is about 30 keV to about 40 keV. When the boron difluoride is implanted with an ion implantation energy of 30 keV, it has an identical doping profile to which the boron is implanted with an ion implantation energy of 6.7 keV.

Figure 4E:
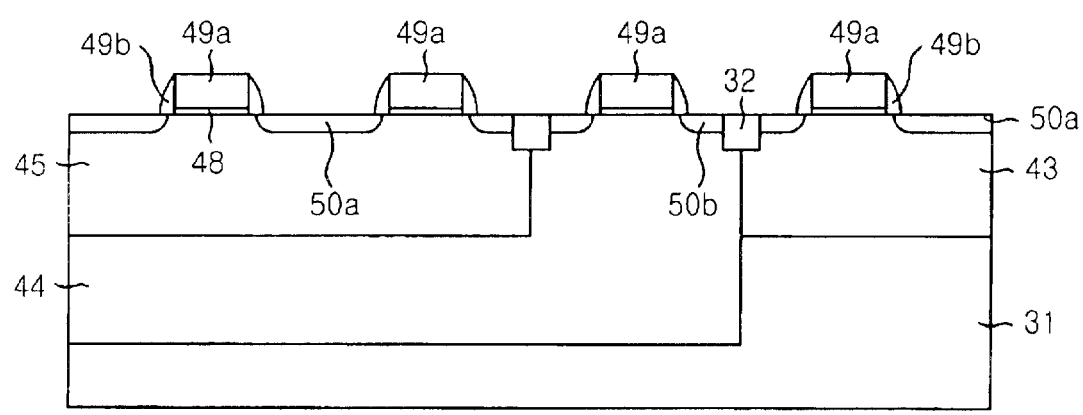

Referring to FIG. 4E, after removing the fourth mask 46, a gate oxide layer 48 and a gate electrode 49A are formed on a predetermined region of the semiconductor substrate 31, and a spacer 49B is formed on sidewalls of the gate electrode 49A. Thereafter, impurities of n and p types are implanted with a blanket ion implantation without a mask process, so that an n$^+$ source/drain region 50A of an NMOSFET and a p$^+$ pocket ion implantation region 50B, on a region for a PMOSFET, are formed in the cell transistor and a peripheral circuit, respectively. At this time, a dose of about $1 \times 10^{13}$ ions/cm$^2$ to about $5 \times 10^{13}$ ions/cm$^2$ is used to form the n$^+$ source/drain region 50a.

As mentioned the above, the threshold voltage of the cell transistor can be increased by controlling a concentration of the semiconductor substrate, that is, the dose of the p-well i in accordance with the present invention, in stead of controlling conditions of a threshold voltage ion implantation and a source/drain ion implantation for the cell transistor.

The triple well has a shallow well profile, that is, the well profile is near to a channel region.

Figure 5:
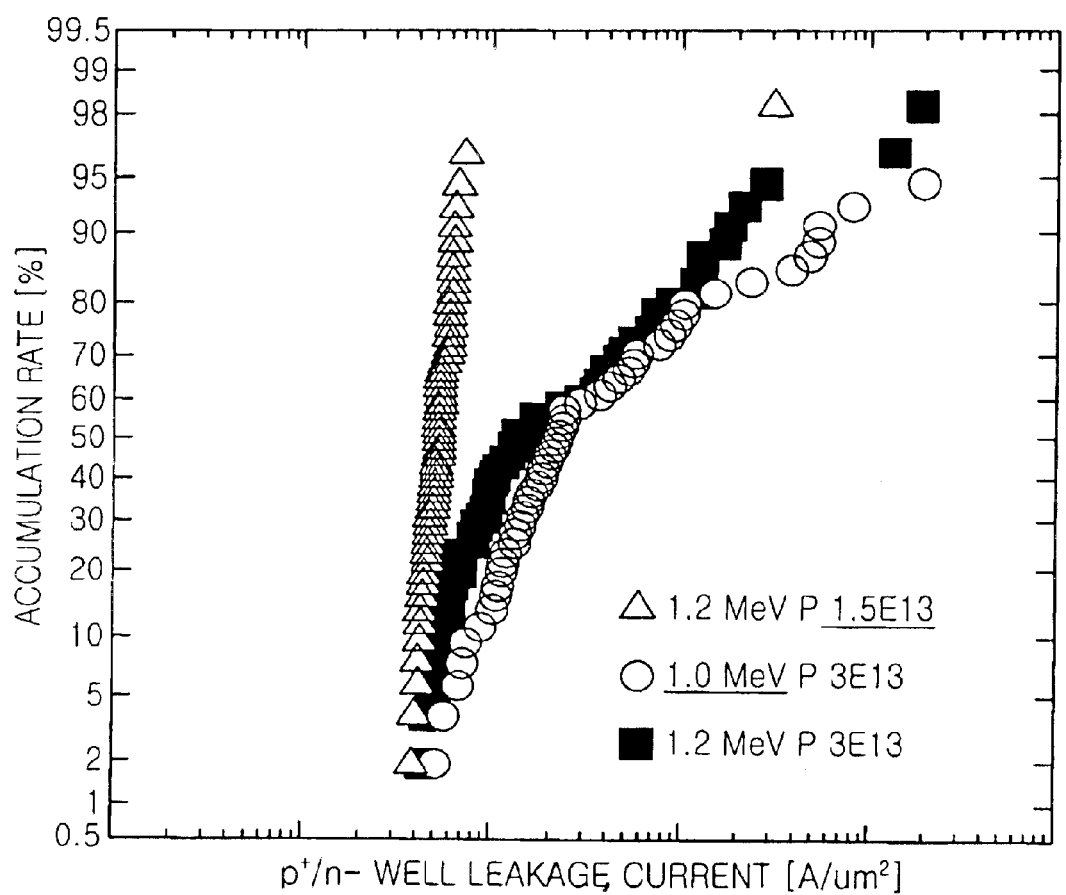
FIG. 5 is a graph showing a p+-junction/n-well leakage current characteristic according to a deep-well ion implantation process conditions.

FIG. 5 is a graph showing leakage current characteristic at a p+ junction/n-well according to a deepp-well ion implantation process conditions, such as the dose, an ion implantation energy and so on.

Referring to FIG. 5, when the ion implantation energy is reduced from about 1.2 MeV to about 1.0 MeV, junction leakage characteristics are mostly similar each other. However, when the dose is reduced, a constant leakage current characteristic can be secured.

As the dose of the deep n-well is reduced, an annealing process for removing defects caused from a deep n-well ion implantation can be omitted.

Figure 6:
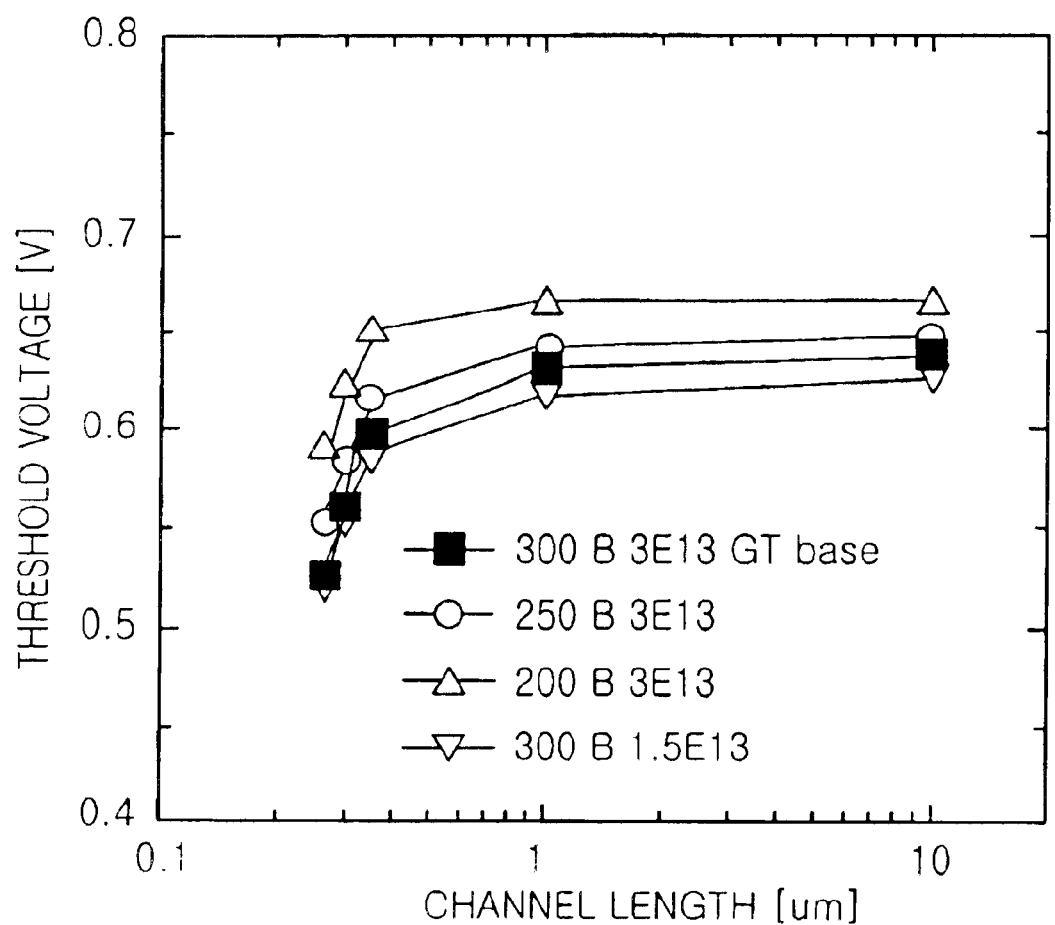
FIG. 6 is a graph showing a threshold voltage roll-off characteristic of the second p-well according to p-well ion implantation process conditions.

FIG. 6 is a graph showing a threshold voltage roll-off characteristic of the second p-well according to p-well ion implantation process conditions, such as dose, ion implantation energy and so on. As the ion implantation energy is reduced, a boron concentration of a surface channel is increased so that the threshold voltage is increased.

As shown in FIG. 6, even though the dose of the ion implantation for adjusting the threshold voltage is not increased, the desired threshold voltage can be obtained. Also, the counter doping effect with the cell junction is reduced and a resistance and an electric field are reduced, so that the refresh time is increased. Namely, a reliability of the device is improved.

Accordingly, increase of the threshold voltage of the cell transistor and of the refresh time is expected. the process can be simplified in accordance with the present invention, since the well annealing process for removing defects can be omitted.

While the present invention has been described with respect to the particular embodiments, it will be apparent to those skilled in the art that various changes and modifications may be made without departing from the spirit and scope of the invention as defined in the following claims.

What is claimed is:

1. A method for fabricating a triple well in a semiconductor device, comprising the steps of:

forming a first well of a first conductive type with a first concentration by a first ion-implantation process, wherein the first concentration is the minimum dose capable of isolating neighboring wells each other; and forming a second well of a second conductive type with a second concentration by a second ion-implantation process, wherein the second well includes a first region surrounded by the first well and a second region isolated from the first region by the first well, wherein the first ion-implantation process is performed to form a third region by implanting impurities with a dose of about $5\times10^{12}$ ions/cm$^2$ to about $1.5\times10^{13}$ ions/cm$^2$ and with an ion-implantation energy of about 0.6 MeV to about 1.6 MeV.

2. The method as recited in claim 1, after the step of forming the first well, further comprising the steps of:

forming a fourth region between the third region and a surface of the semiconductor substrate by implanting impurities with a dose of about $5\times10^{12}$ ions/cm$^2$ to about $2\times10^{13}$ ions/cm$^2$; and forming a field stop region for the second conductive type between the fourth region and the surface of the semiconductor substrate by implanting impurities with a third impurity dose of about $5\times10^{11}$ ions/cm$^2$ to about $2\times10^{13}$ ions/cm$^2$.

3. The method as recited in claim 2, wherein the fourth region is formed with an ion-implantation energy of about 500 KeV to about 600 KeV.

4. The method as recited in claim 3, wherein the field stop region is formed with an ion-implantation energy of about 150 KeV to about 300 KeV.

5. The method as recited in claim 1, wherein the step of forming the second well includes the steps of:

forming a fifth region by implanting impurities with a dose of about $5\times10^{12}$ ions/cm$^2$ to about $3\times10^{13}$ ions/cm$^2$ in the first well; and forming a field stop region of the first conductive type by implanting impurities with a dose of about $5\times10^{11}$ ions/cm$^2$ to about $1\times10^{13}$ ions/cm$^2$ between the surface of the semiconductor substrate and the fifth region.

6. The method as recited in claim 5, wherein the fifth region is formed with an ion-implantation energy of about 180 KeV to about 300 KeV.

7. The method as recited in claim 5, wherein the field stop region is formed with an ion-implantation energy of about 50 KeV to about 80 KeV.

8. The method as recited in claim 1, further comprising the step of activating impurities implanted in the first and second wells by performing a thermal treatment process after forming the second well.

9. The method as recited in claim 1, wherein a well annealing process for removing defects can be omitted.

10. A method forming a semiconductor device, comprising steps of:

forming a first well of a first conductive type with a first concentration by a first ion-implantation process in a semiconductor substrate, wherein the first concentration is the minimum dose capable of isolating neighboring wells each other;

forming a second well of a second conductive type with a second concentration, the second well surrounded by the first well;

implanting impurities of the second conductive type to adjust a threshold voltage of a transistor to be formed on a surface of the semiconductor substrate;

forming a gate oxide layer and a gate electrode on a predetermined region on the second well; and forming source/drain regions with a first conductive type at both sides of the gate electrode in the second well, wherein the first ion-implantation process is performed to form a third region with a does of about $5\times10^{12}$ ions/cm$^2$ to about $1.5\times10^{13}$ ions/cm$^2$ and with an ion-implantation energy of about 0.6 MeV to about 1.6 MeV.

11. The method as recited in claim 10, after the step of forming the first well further comprising the steps of:

forming a fourth region between the third region and a surface of the semiconductor substrate by implanting impurities with a dose of about $5\times10^{12}$ ions/cm$^2$ to about $2\times10^{13}$ ions/cm$^2$; and forming a field stop region for the second conductive type between the fourth region and the surface of the semiconductor substrate by implanting impurities with a dose of about $5\times10^{11}$ ions/cm$^2$ to about $2\times10^{13}$ ions/cm$^2$.

12. The method as recited in claim 11, wherein the fourth region is formed with an ion-implantation energy of about 500 KeV to about 600 KeV.

13. The method as recited in claim 11, wherein the field stop region is formed with an ion-implantation energy of about 150 KeV to about 300 KeV.

14. The method as recited in claim 10, wherein the step of forming the second well includes the steps of:

forming a fifth region by implanting impurities with a dose of about $5\times10^{12}$ ions/cm$^2$ to about $3\times10^{13}$ ions/cm$^2$ in the first well; and forming a field stop region of the first conductive type by implanting impurities with a dose of about $5\times10^{11}$ ions/cm$^2$ to about $1\times10^{13}$ ions/cm$^2$ between the surface of the semiconductor substrate and the fifth region.

15. The method as recited in claim 14, wherein the fifth region is formed with an ion-implantation energy of about 180 KeV to about 300 KeV.

16. The method as recited in claim 14, wherein the field stop region is formed with an ion-implantation energy of about 50 KeV to about 80 KeV.

17. The method as recited in claim 10, wherein the step of implanting impurities of the second conductive type is carried out at an ion-implantation energy selected from about 15 KeV to about 40 KeV and about 30 KeV to about 40 KeV and at an impurity concentration of about $5\times10^{12}$ ions/cm$^2$ to about $1.5\times10^{13}$ ions/cm$^2$.

18. The method as recited in claim 10, wherein a well annealing process for removing defects can be omitted.

19. A method for fabricating a triple well in a semiconductor substrate, comprising the steps of:

forming a first region by implanting impurities of a first conductive type with a dose of about $5\times10^{12}$ ions/cm$^2$ to about $1.5\times10^{13}$ ions/cm$^2$ and an ion-implantation energy of 0.6 MeV to about 1.6 MeV;

forming a second region by implanting impurities of the first conductive type with a dose of about $5\times10^{12}$ ions/cm$^2$ to about $2\times10^{13}$ ions/cm$^2$ and an ion-implantation energy of 500 KeV to about 600 KeV;

forming a first field stop region of a second conductive type with a dose of $5\times10^{11}$ ions/cm$^2$ to about $2\times10^{13}$ ions/cm$^2$ and an ion-implantation energy of about 150 KeV to about 300 KeV between the second region and the surface of the semiconductor substrate;

forming a third region by implanting impurities of the second conductive type with a dose of about $5\times10^{12}$ ions/cm$^2$ to about $3\times10^{13}$ ions/cm$^2$ and an ion-implantation energy of about 180 KeV to about 300

KeV between the first region and the surface of the semiconductor substrate, the third region includes a fourth region and a fifth region isolated each other by the second region; and forming a second field stop region of the first conductive type with a dose of $5 \times 10^{11}$ ions/cm² to about $1 \times 10^{13}$ ions/cm² and an ion-implantation energy of about 50 KeV to about 80 KeV.

20. The method as recited in claim 19, wherein a well annealing process for removing defects can be omitted.

* * * * *